(12) United States Patent
Shimizu et al.

(10) Patent No.: US 9,118,302 B2
(45) Date of Patent: Aug. 25, 2015

(54) FILTER MODULE

(75) Inventors: Hidehito Shimizu, Osaka (JP);
Hiroyuki Nakamura, Osaka (JP);
Takahiro Sato, Osaka (JP); Tetsuya Tsurunari, Osaka (JP)

(73) Assignee: SKYWORKS PANASONIC FILTER SOLUTIONS JAPAN CO., LTD, Kadoma-Shi (JP)

( * ) Notice: Subject to any disclaimer, the term of this patent is extended or adjusted under 35 U.S.C. 154(b) by 0 days.

(21) Appl. No.: 14/237,168

(22) PCT Filed: Aug. 7, 2012

(86) PCT No.: PCT/JP2012/005015
§ 371 (c)(1),
(2), (4) Date: Feb. 5, 2014

(87) PCT Pub. No.: WO2013/021626
PCT Pub. Date: Feb. 14, 2013

(65) Prior Publication Data
US 2014/0167877 A1    Jun. 19, 2014

(30) Foreign Application Priority Data

Aug. 8, 2011 (JP) ................................. 2011-173420
Feb. 14, 2012 (JP) ................................. 2012-029235

(51) Int. Cl.
*H03H 9/70* (2006.01)
*H04B 1/44* (2006.01)
*H03H 7/46* (2006.01)
*H03H 7/38* (2006.01)
*H03H 11/34* (2006.01)
*H04B 1/00* (2006.01)

(52) U.S. Cl.
CPC ................. *H03H 7/461* (2013.01); *H03H 7/38* (2013.01); *H03H 7/463* (2013.01); *H03H 7/465* (2013.01); *H03H 9/70* (2013.01); *H03H 11/344* (2013.01); *H04B 1/006* (2013.01)

(58) Field of Classification Search
USPC .................. 333/101, 103, 126, 129, 132, 133
See application file for complete search history.

(56) References Cited

U.S. PATENT DOCUMENTS 7,015,870 B2 * 3/2006 Guitton et al. ................ 343/860
7,171,235 B2 * 1/2007 Haapoja ..................... 455/553.1
(Continued)

FOREIGN PATENT DOCUMENTS

JP    2003-87150    3/2003
JP    2005-64780    3/2005
(Continued)

OTHER PUBLICATIONS

International Search Report of PCT Application No. PCT/JP2012/005015 dated Nov. 6, 2012.

*Primary Examiner* — Dinh Le
(74) *Attorney, Agent, or Firm* — Lando & Anastasi, LLP

(57) ABSTRACT

In a filter module capable of handling multiple bands, cross wiring with an RF-IC is to be solved. The filter module includes: an antenna terminal; first and second transmission filters; first and second reception filters; a first switch circuit connected to the antenna terminal, and selectively connected to the first and second transmission filters; a second switch circuit connected to the antenna terminal, and selectively connected to the first and second reception filters; a first matching circuit connected between the first switch circuit and the first transmission filter or between the second switch circuit and the first reception filter; and a second matching circuit connected between the first switch circuit and the second transmission filter or between the second switch circuit and the second reception filter.

20 Claims, 17 Drawing Sheets

(56) References Cited

U.S. PATENT DOCUMENTS

| 8,803,632 B2* | 8/2014 | Takeuchi | 333/101 |
| 2004/0048634 A1 | 3/2004 | Satoh et al. | |
| 2011/0156835 A1 | 6/2011 | Nagai | |

FOREIGN PATENT DOCUMENTS

| JP | 2010-45563 | 2/2010 |
| WO | 2010/032389 | 3/2010 |

* cited by examiner

F I G. 1
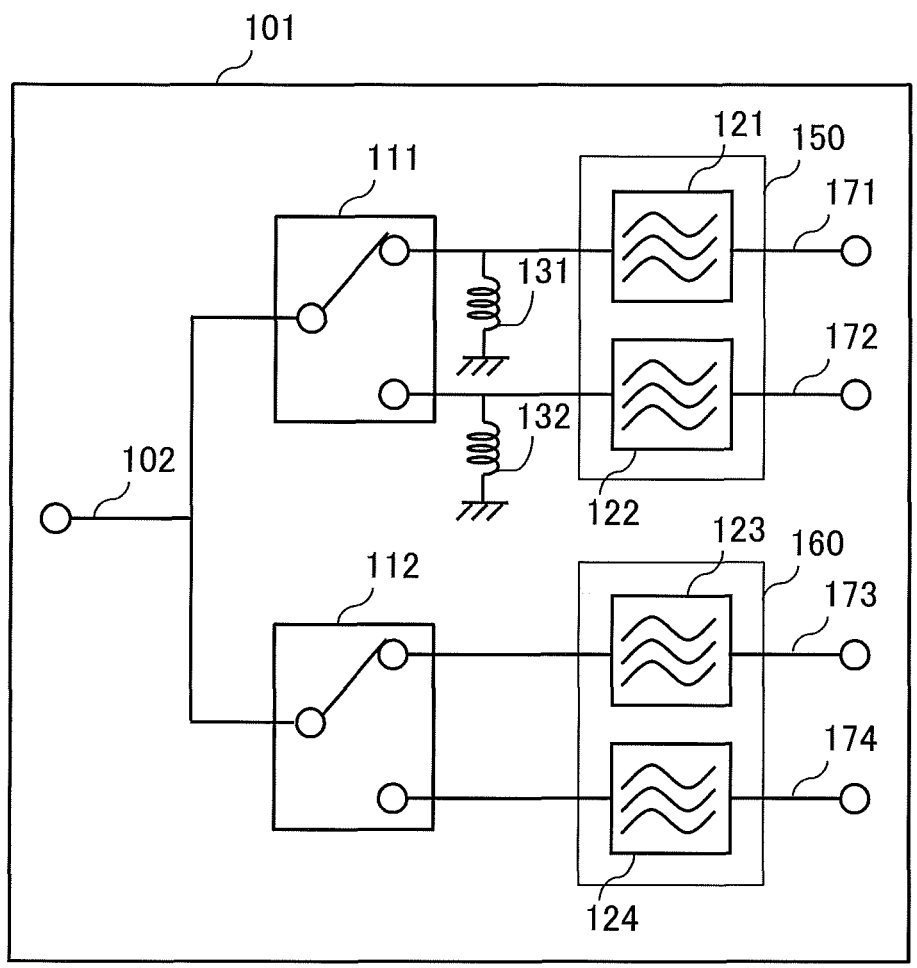

F I G. 9
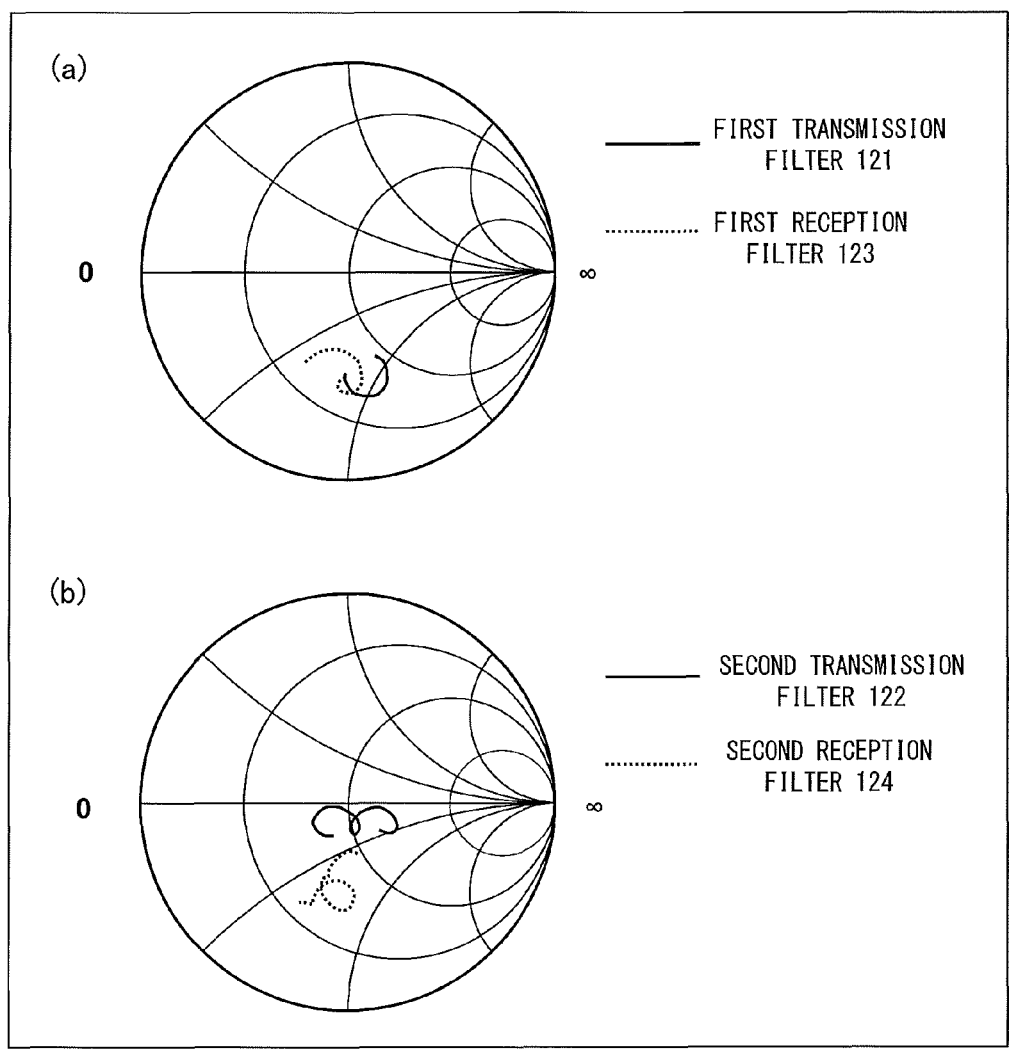

FILTER MODULE

CROSS-REFERENCE TO RELATED APPLICATIONS

The present application is a U.S. national phase application of international application PCT/JP2012/005015 filed on Aug. 7, 2012, which claims priority to Japanese Patent Application No. 2011-173420 filed on Aug. 8, 2011 and Japanese Patent Application No. 2012-029235 filed on Feb. 14, 2012, the contents all of which are incorporated herein by reference.

TECHNICAL FIELD

The present invention relates to a filter module.

BACKGROUND ART

The number of duplexers mounted on a mobile phone has been increasing associated with the mobile phone's ability to handle multiple bands and multiple modes. On the other hand, in order to solve the shortage of space caused by acceleration in adding multiple functions to the mobile phone, the request for reducing size of a wireless section has become strong. Because of such background, expectation is high for a multi-duplexer module having integrated therein multiple duplexers.

Patent Literature 1 discloses a multi-duplexer module 900 shown in FIG. 16. The multi-duplexer module 900 includes an antenna terminal 902, a matching circuit 931, a first duplexer 932, and a second duplexer 933. The first duplexer 932 is connected to the antenna terminal 902 via the matching circuit 931, and the second duplexer 933 is connected directly to the antenna terminal 902.

CITATION LIST

Patent Literature

[PTL 1] Japanese Laid-Open Patent Publication No. 2010-45563

SUMMARY OF THE INVENTION

Problems to be Solved by the Invention

FIG. 17 shows an example of connection between such a multi-duplexer module, and an antenna and an RF-IC (Radio Frequency-Integrated Circuit). When multiple duplexers each including a transmission side terminal and a reception side terminal are arranged, the transmission side terminals and the reception side terminals will be arranged alternately. Generally in an RF-IC (Radio Frequency-Integrated Circuit) that supports multiple bands, multiple transmission side terminals and reception side terminals are each arranged together. Therefore, cross wiring occurs among wires between a duplexer and an RF-IC, or with wires from an antenna terminal, causing a problem of deterioration in isolation characteristic.

Furthermore, in a multi-duplexer module, it is also important to suppress deterioration of isolation characteristic attributed to causes other than cross wiring. In particular, the need to suppress deterioration of isolation characteristic is high when passbands of each of the duplexers are adjacent to each other.

Therefore, an objective of the present invention is to solve cross wiring with an RF-IC in a filter module capable of handling multiple bands, and suppress deterioration of isolation characteristic when passbands of each band are adjacent to each other.

Solution to the Problems

The present invention includes: antenna terminal; a first transmission filter whose passband is a transmission band of a first band; a second transmission filter whose passband is a transmission band of a second band; a first reception filter whose passband is a reception band of the first band; a second reception filter whose passband is a transmission band of the second band; a first switch circuit connected to the antenna terminal, and connected to respective switch side terminals of the first transmission filter and the second transmission filter; a second switch circuit connected to the antenna terminal, and connected to respective switch side terminals of the first reception filter and the second reception filter; and at least two matching circuits. Furthermore, at least two routes are each connected to one of the at least two matching circuits, the at least two routes being at least two among: a first route that is a signal route between the first switch circuit and first transmission filter or between the second switch circuit and the first reception filter; a second route that is a signal route between the first switch circuit and the second transmission filter or between the second switch circuit and the second reception filter; and a third route that is a signal route through the antenna terminal, the first switch circuit, and second switch circuit.

Preferably, at least one of the respective passbands of the first transmission filter and the first reception filter overlaps the passband of the second transmission filter or the second reception filter, and one of the at least two matching circuits is connected to a switch side terminal of, among the first transmission filter and the first reception filter, the one whose passband does not overlap the passband of the second transmission filter or the second reception filter, or the one whose overlapping passband has a narrower width.

Preferably, at least one of the respective passbands of the second transmission filter and the second reception filter overlaps the passband of the first transmission filter or the first reception filter, and one the two matching circuits is connected to a switch side terminal of, among the second transmission filter and the second reception filter, the one whose passband does not overlap the passband of the first transmission filter or the first reception filter, or the one whose overlapping passband has a narrower width.

Preferably, one of the at least two matching circuits is connected to, among the first transmission filter and the first reception filter, the one having a lower impedance on a side of the antenna terminal in the respective passbands.

Preferably, one of the at least two matching circuits is connected to, among the second transmission filter and the second reception filter, the one having a lower impedance on a side of the antenna terminal in the respective passbands.

Furthermore, the first switch circuit may have a state of being electrically disconnected from both the first transmission filter and the second transmission filter, and the second switch circuit may have a state of being electrically disconnected from both the first reception filter and the second reception filter.

Furthermore, the transmission band of the first band and the transmission band of the second band may overlap each other, and the first transmission filter and the second transmission filter may be formed from a single filter.

Furthermore, the reception band of the first band and the reception band of the second band may overlap each other, and the first reception filter and the second reception filter may be formed from a single filter.

Preferably, the filter module may further include a third transmission filter whose passband is a transmission band of a third band. Preferably, the first switch circuit is further connected to a switch side terminal of the third transmission filter, and, among the first transmission filter, the second transmission filter, and the third transmission filter, a filter whose center frequency of the passband is the lowest is disposed between the other two filters.

Preferably, the filter module may further include a third reception filter whose passband is a reception band of a third band. Preferably, the second switch circuit is further connected to a switch side terminal of the third reception filter, and, among the first reception filter, the second reception filter, and the third reception filter, a filter whose center frequency of the passband is the lowest is disposed between the other two filters.

Furthermore, one of the at least two matching circuits may be connected to a signal route between the first switch circuit and the third transmission filter.

Furthermore, one of the at least two matching circuits may be connected to a signal route between the second switch circuit and the third reception filter.

Furthermore, the filter module may further include a low pass filter connected to the first switch circuit or the second switch circuit.

Furthermore, each of the matching circuits may be formed from inductors parallelly grounded and connected to the signal routes.

Furthermore, in the filter module, a first branch circuit and a second branch circuit may be provided instead of the first switch circuit and the second switch circuit.

Advantageous Effects of the Invention

With the present invention, it is possible to solve cross wiring with an RF-IC in a filter module capable of handling multiple bands, and suppress deterioration of isolation characteristic when passbands of each band are adjacent to each other.

BRIEF DESCRIPTION OF THE DRAWINGS

FIG. 1 shows a filter module according to a first embodiment of the present invention.

FIG. 9 shows the impedance characteristics of each filter in the filter module according to the fourth embodiment of the present invention.

DESCRIPTION OF EMBODIMENTS

First Embodiment

Figure 2:
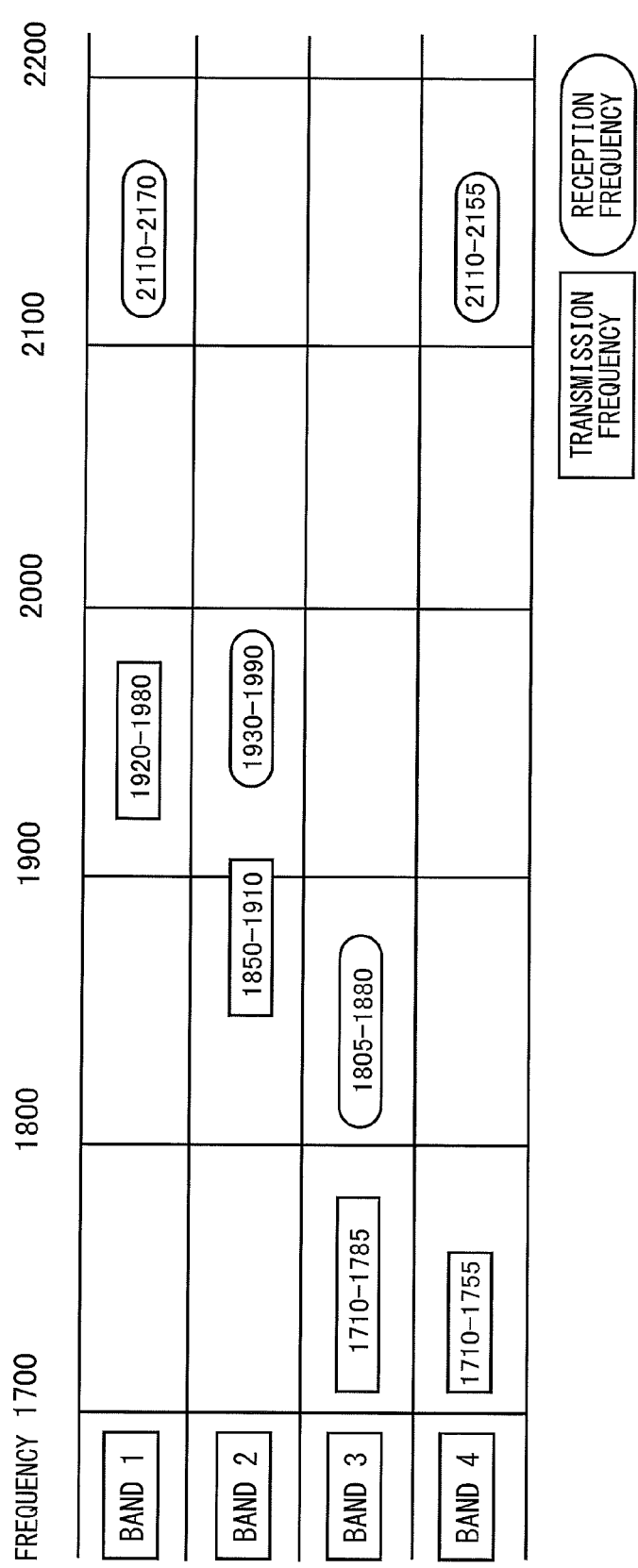
FIG. 2 shows one example of frequency bands.

In the following, a first embodiment of the present invention will be described. FIG. 1 is a configurational drawing of a filter module 100 according to the present embodiment. The filter module 100 includes a substrate 101, and components disposed on the substrate, such as an antenna terminal 102, a first switch circuit 111 and a second switch circuit 112 each having one end thereof connected to the antenna terminal 102, a first transmission filter 121 and a second transmission filter 122 whose respective output terminals are connected to the other ends of the first switch circuit 111, and a first reception filter 123 and a second reception filter 124 whose respective input terminals are connected to the other ends of the second switch circuit 112. In addition, a first matching circuit 131 is connected between the first switch circuit 111 and the first transmission filter 121, and a second matching circuit 132 is connected between the first switch circuit 111 and the second transmission filter 122.

The first transmission filter 121 and the second transmission filter 122 are disposed on a first predetermined area 150 on the substrate 101, and the first reception filter 123 and the second reception filter 124 are disposed on a second predetermined area 160 on the substrate 101. The first predetermined area 150 and the second predetermined area 160 are both rectangle areas and do not overlap each other.

With respect to the filters 121 to 124, each of the filters may be formed separately on a piezoelectric substrate, or a plurality of the filters may be formed on a single piezoelectric substrate. Furthermore, it is also possible to form the first transmission filter 121 and the second transmission filter 122 on a single piezoelectric substrate, and form the first reception filter 123 and the second reception filter 124 on another single piezoelectric substrate. In addition, it is also possible to form the whole filter module 100 into a single package, or form the first transmission filter 121 and the second transmission filter 122 into a single package and form the first reception filter 123 and the second reception filter 124 into a separate single package. Furthermore, each of the filters may be bare-chip mounted onto the substrate 101.

FIG. 2 shows one example of frequency bands used for transmission and reception. In band 1, a transmission band is 1920 to 1980 MHz, and a reception band is 2110 to 2170 MHz. In band 2, a transmission band is 1850 to 1910 MHz, and a reception band is 1930 to 1990 MHz. In band 3, a transmission band is 1710 to 1785 MHz, and a reception band is 1805 to 1880 MHz. In band 3, a transmission band is 1710 to 1785 MHz, and a reception band is 1805 to 1880 MHz. In band 4, a transmission band is 1710 to 1755 MHz, and a reception band is 2110 to 2155 MHz.

In one example, the passbands of the first transmission filter 121 and the first reception filter 123 are the transmission band and the reception band of band 1, respectively. In one example, the passbands of the second transmission filter 122 and the second reception filter 124 are the transmission band and the reception band of band 2, respectively. The first switch circuit 111 and the second switch circuit 112 are high frequency switches that are respectively switched to the first transmission filter 121 side and the first reception filter 123 side when transmission and reception are to be conducted using band 1, and are respectively switched to the second transmission filter 122 side and the second reception filter 124 side when transmission and reception are to be conducted using band 2.

The first matching circuit 131 performs matching between the first transmission filter 121 and the first reception filter 123 when band 1 is to be used. Furthermore, the second matching circuit 132 performs matching between the second transmission filter 122 and the second reception filter 124 when band 2 is to be used. These matching circuits 131 and 132 can be formed respectively from inductors 141 and 142 parallelly grounded and connected to signal routes. The matching circuits may be formed using other circuit configurations.

In the filter module 100, the first transmission filter 121 and the second transmission filter 122 are adjacently arranged, the first reception filter 123 and the second reception filter 124 are adjacently arranged, and these, together with the first switch circuit 111 and the second switch circuit 112, form a plurality of duplexers. Thus, the filter module 100 forms a multi-duplexer module as a result of transmission side terminals 171 and 172 and reception side terminals 173 and 174 of the respective filters 121 to 124 being arranged together.

Figure 3:
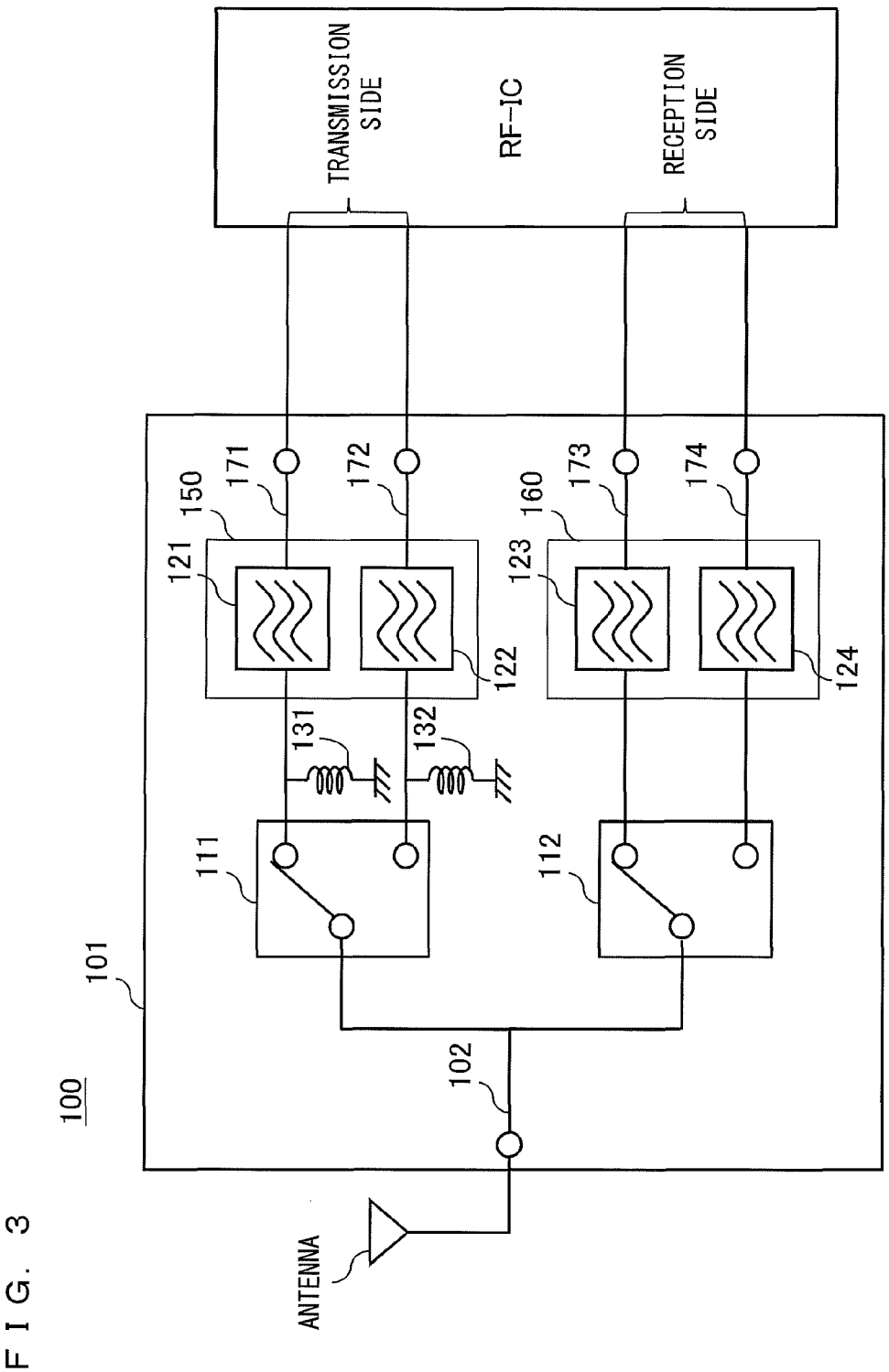
FIG. 3 shows an example of connection between an RF-IC and the filter module according to the first embodiment of the present invention.

FIG. 3 shows an example of connections between the filter module 100, and the RF-IC (Radio Frequency-Integrated Circuit) and the antenna. The connecting lines between the RF-IC and each of the filters 121 to 124 of the filter module 100 can be parallelly arranged, and thereby it is possible to solve cross wiring and suppress deterioration of isolation characteristics. It should be noted that, it is possible to have the first matching circuit 131 connected between the second switch circuit 112 and the first reception filter 123, and have the second matching circuit 132 connected between the second switch circuit 112 and the second reception filter 124. In order to avoid the connecting lines from being pulled around in a lengthy manner, each of the filters 121 to 124 are preferably arranged, for example, on a straight line.

Figure 4:
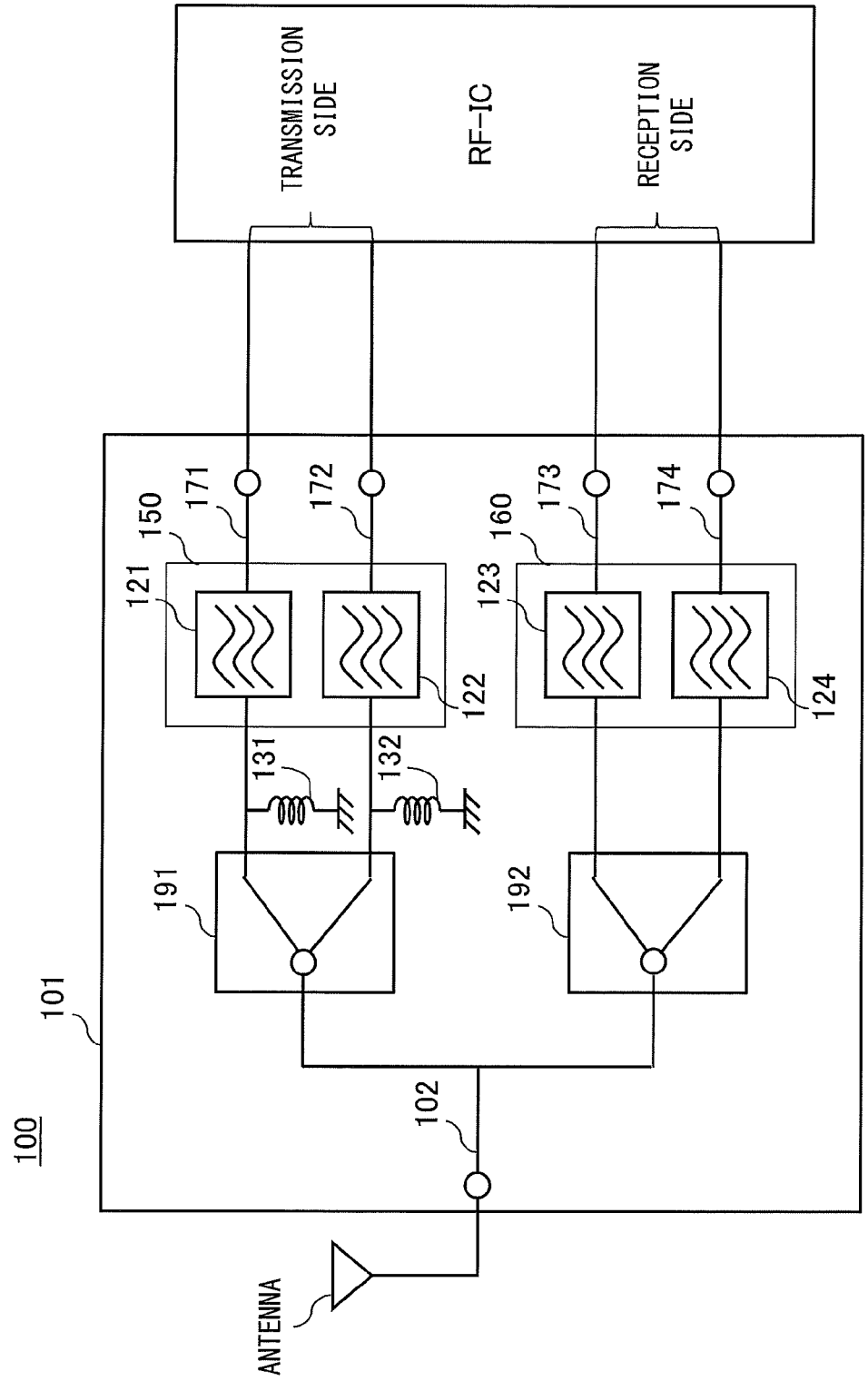
FIG. 4 shows an example of connections between an RF-IC and the filter module according to a modification of the first embodiment of the present invention.

It should be noted that, as a modification of the present embodiment, a branch circuit may be used instead of the switch circuit. FIG. 4 shows an example of connections between the filter module 100 according to the modification, and an RF-IC and an antenna. In the present modification, a first branch part 191 and a second branch part 192 are used instead of the first switch circuit 111 and the second switch circuit 112.

Also in the present modification, the connecting lines between the RF-IC and each of the filters 121 to 124 of the filter module 100 can be parallelly arranged, and thereby it is possible to solve cross wiring and suppress deterioration of isolation characteristics. In the example shown in FIG. 4, although an example has been shown in which the first matching circuit 131 is connected between the first branch part 191 and the first transmission filter 121, and the second matching circuit 132 is connected between the first branch part 191 and the second transmission filter 122; it is possible to have the first matching circuit 131 connected between the second branch part 192 and the first reception filter 123, and have the second matching circuit 132 connected between the second branch part 192 and the second reception filter 124.

Second Embodiment

Figure 5:
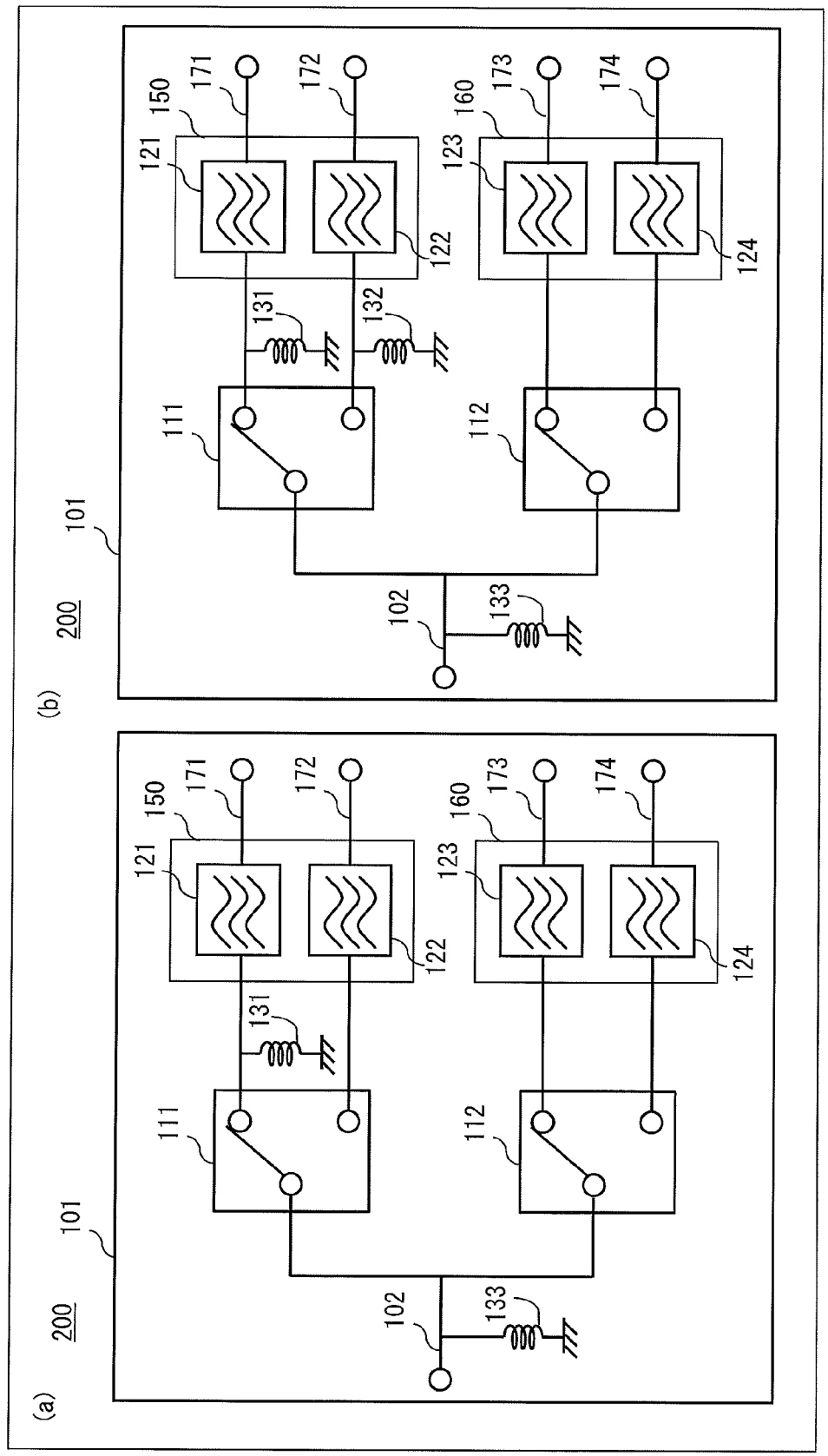
FIG. 5 shows the filter module according to a second embodiment of the present invention.

In the following, a second embodiment of the present invention will be described. In FIG. 5, (a) is a configurational drawing of a filter module 200 according to the present embodiment. The filter module 200 is different in terms of having a third matching circuit 133 connected between the antenna terminal 102, and the first switch circuit 111 and the second switch circuit 112, instead of having the second matching circuit 132 in the filter module 100 according to the first embodiment. The third matching circuit 133 can be formed from an inductor 143 parallelly grounded and connected to the signal route. The matching circuit may be formed using other circuit configurations.

In the filter module 200, the first matching circuit 131 and the third matching circuit 133 cooperate to perform matching between the first transmission filter 121 and the first reception filter 123 when band 1 is to be used. In addition, the third matching circuit 133 performs matching between the second transmission filter 122 and the second reception filter 124 when band 2 is to be used.

Instead of having the first matching circuit 131 of the filter module 100 according to the first embodiment, the filter module 200 may have the third matching circuit 133 connected between the antenna terminal 102, and the first switch circuit 111 and the second switch circuit 112; and have the second matching circuit 132 and the third matching circuit 133 cooperate to perform matching between the second transmission filter 122 and the second reception filter 124 when band 2 is to be used, and have the third matching circuit 133 perform matching between the first transmission filter 121 and the first reception filter 123 when band 1 is to be used. Alternatively, as shown in (b) of FIG. 5, the filter module 200 may include the first matching circuit 131 and the second matching circuit 132 of the filter module 100 according to the first embodiment, and also include the third matching circuit 133 connected between the antenna terminal 102, and the first switch circuit 111 and the second switch circuit 112. With this, the filter module 200 may have the first matching circuit 131 and the third matching circuit 133 cooperate to perform matching between the first transmission filter 121 and the first reception filter 123 when band 1 is to be used, and have the second matching circuit 132 and the third matching circuit 133 cooperate to perform matching between the second transmission filter 122 and the second reception filter 124 when band 2 is to be used.

Third Embodiment

Figure 6:
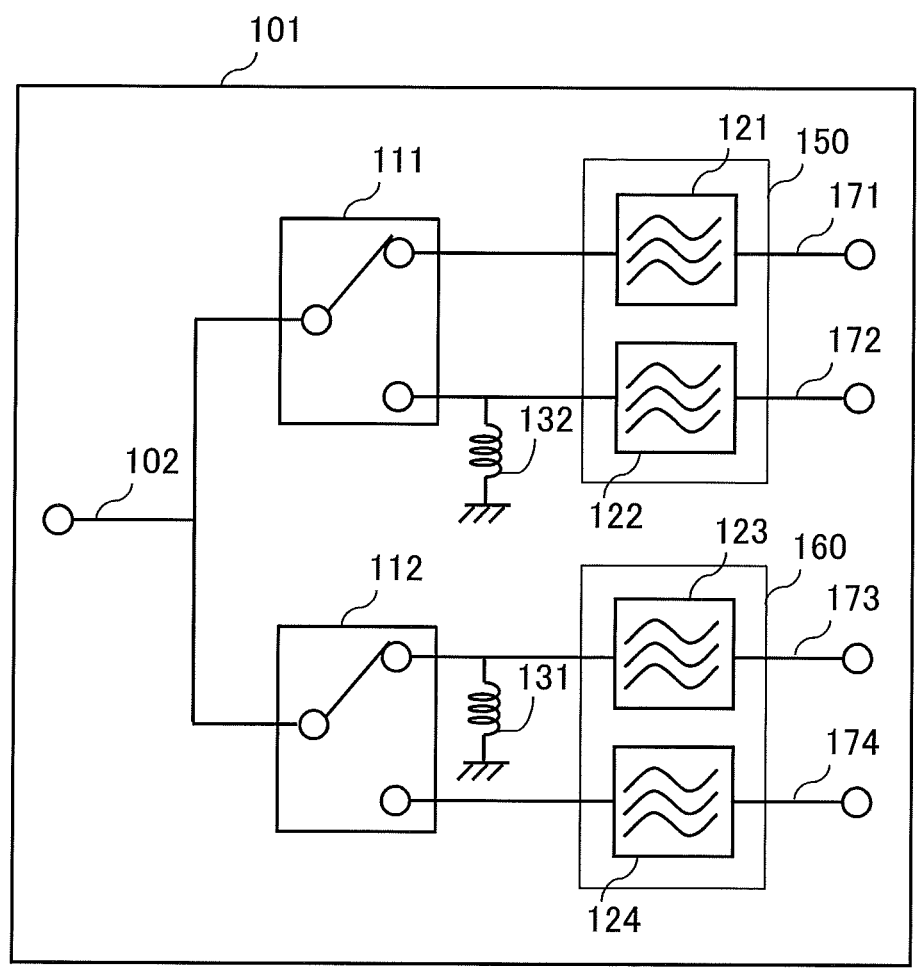
FIG. 6 shows the filter module according to a third embodiment of the present invention.

In the following, a third embodiment of the present invention will be described. FIG. 6 is a configurational drawing of a filter module 300 according to the present embodiment. The filter module 300 of the present embodiment is obtained by determining connection locations of the first matching circuit 131 and the second matching circuit 132 in accordance with a principle described next, when parts of bandwidth of two bands that are to be used overlap each other in the filter module 100 according to the first embodiment.

When a passband of at least one of the first transmission filter 121 and the first reception filter 123 overlaps a passband of either the second transmission filter 122 or the second reception filter 124; the first matching circuit 131 is connected to, among the first transmission filter 121 and the first reception filter 123, the one whose passband is not overlapped or the one whose overlapping bandwidth is narrower, and a matching circuit is not connected to the other one.

Furthermore, when a passband of at least one of the second transmission filter 122 and the second reception filter 124 overlaps a passband of either the first transmission filter 121 or the first reception filter 123; the second matching circuit 132 is connected to, among the second transmission filter 122 and the second reception filter 124, the one whose passband is not overlapped, or the one whose overlapping bandwidth is narrower, and a matching circuit is not connected to the other one.

In one example, the filter module 300 supports band 1 and band 2. More specifically, the passband of the first transmission filter 121 is the transmission band of band 1, and the passband of the first reception filter 123 is the reception band of band 1. Furthermore, the passband of the second transmission filter 122 is the transmission band of band 2, and the passband of the second reception filter 124 is the reception band of band 2.

Therefore, the passband of the first transmission filter 121 does not overlap the passband of the second transmission filter 122, but overlaps the passband of the second reception filter 124. In addition, the passband of the first reception filter 123 does not overlap the passbands of the second transmission filter 122 and the second reception filter 124. Therefore, the first matching circuit 131 is connected between the first reception filter 123 and the second switch circuit 112.

Furthermore, the passband of the second reception filter 124 does not overlap the passband of the first reception filter 123, but overlaps the passband of the first transmission filter 121. In addition, the passband of the second transmission filter 122 does not overlap the passbands of the first transmission filter 121 and the first reception filter 123. Therefore, the second matching circuit 132 is connected between the second transmission filter 122 and the first switch circuit 111.

Figure 7:
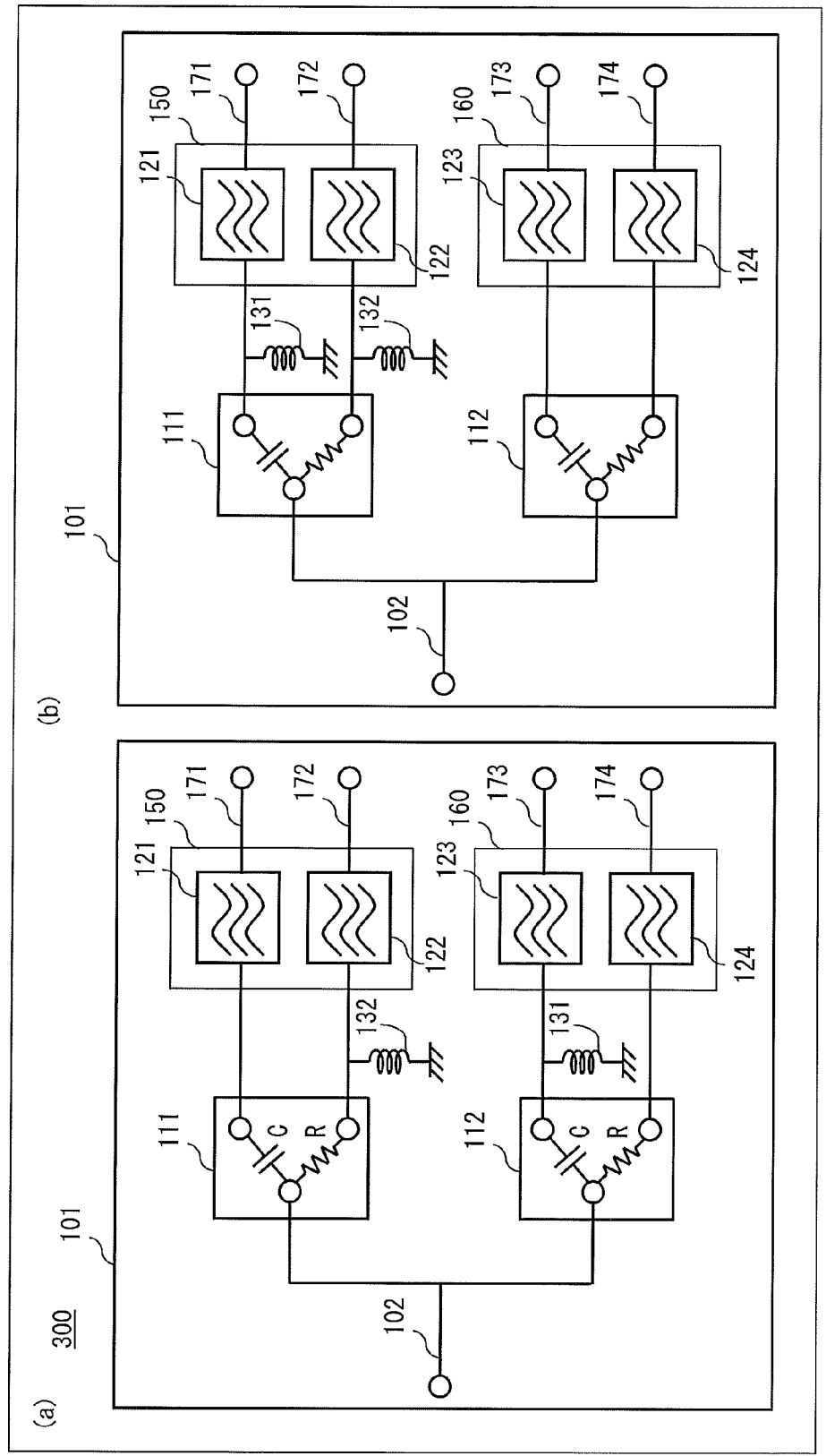
FIG. 7 shows a Comparative Example and the filter module according to the third embodiment of the present invention.

In the following, the reason why the connection locations of the matching circuits 131 and 132 are determined in accordance with such a principle will be described. In FIG. 7, (a) shows the filter module 300 when band 2 is selected, and equivalent circuits are shown for the first switch circuit 111 and the second switch circuit 112. Ideally, the first switch circuit 111 and the second switch circuit 112 are switched such that they are respectively connected only to the second transmission filter 122 and the second reception filter 124 but are disconnected from the first transmission filter 121 and the first reception filter 123. However, in reality, the first switch circuit 111 and the second switch circuit 112 are not fully disconnected from the first transmission filter 121 and the first reception filter 123, respectively, and become equivalent to a state of each being connected via a capacitor C.

As shown in (b) of FIG. 7, if the first matching circuit 131 is connected between the first transmission filter 121 and the first switch circuit 111 instead of between the first reception filter 123 and the second switch circuit 112; since the passbands of the first transmission filter 121 and the second reception filter 124 overlap each other, the first matching circuit 131 performs matching between the first transmission filter 121 and the second reception filter 124 to a certain degree even when having the capacitor C therein. As a result, leakage of signals occurs on the first transmission filter 121 side, and isolation characteristics deteriorate. In order to prevent this, the first matching circuit 131 is connected between the first reception filter 123 and the second switch circuit 112. It should be noted that, when both passbands of the first transmission filter 121 and the first reception filter 123 each overlap a passband of either one of the second transmission filter 122 or the second reception filter 124; by connecting the first matching circuit 131 to either one of the first transmission filter 121 or the first reception filter 123 which has a narrower overlapping bandwidth, leakage of signals can be reduced when compared to making a connection with the one that has a broader overlapping bandwidth.

Similarly, when band 1 is selected, the second matching circuit 132 performs matching between the first transmission filter 121 and the second reception filter 124 to a certain degree. As a result, leakage of signals occurs on the second reception filter 124 side, and isolation characteristics deteriorate. In order to prevent this, the second matching circuit 132 is connected between the second transmission filter 122 and the first switch circuit 111.

In the filter module 300 of the present embodiment, deterioration of isolation characteristics can be further suppressed when the passbands are adjacent to each other. It should be noted that connection location may be determined with the above described principle for only either one of the first matching circuit 131 or the second matching circuit 132. With this, it is also possible to suppress deterioration of isolation characteristics when either band 1 or band 2 is used. Furthermore, in the filter module 200 including the first matching circuit 131 and the third matching circuit 133 according to the second embodiment, when, for example, at least one of the passband of the first transmission filter and the first reception filter overlaps the passband of either the second transmission filter or the second reception filter, it is possible to connect the first matching circuit 131 to, among the first transmission filter and the first reception filter, the one whose passband is not overlapped or has a narrower overlapping bandwidth.

Fourth Embodiment

Figure 8:
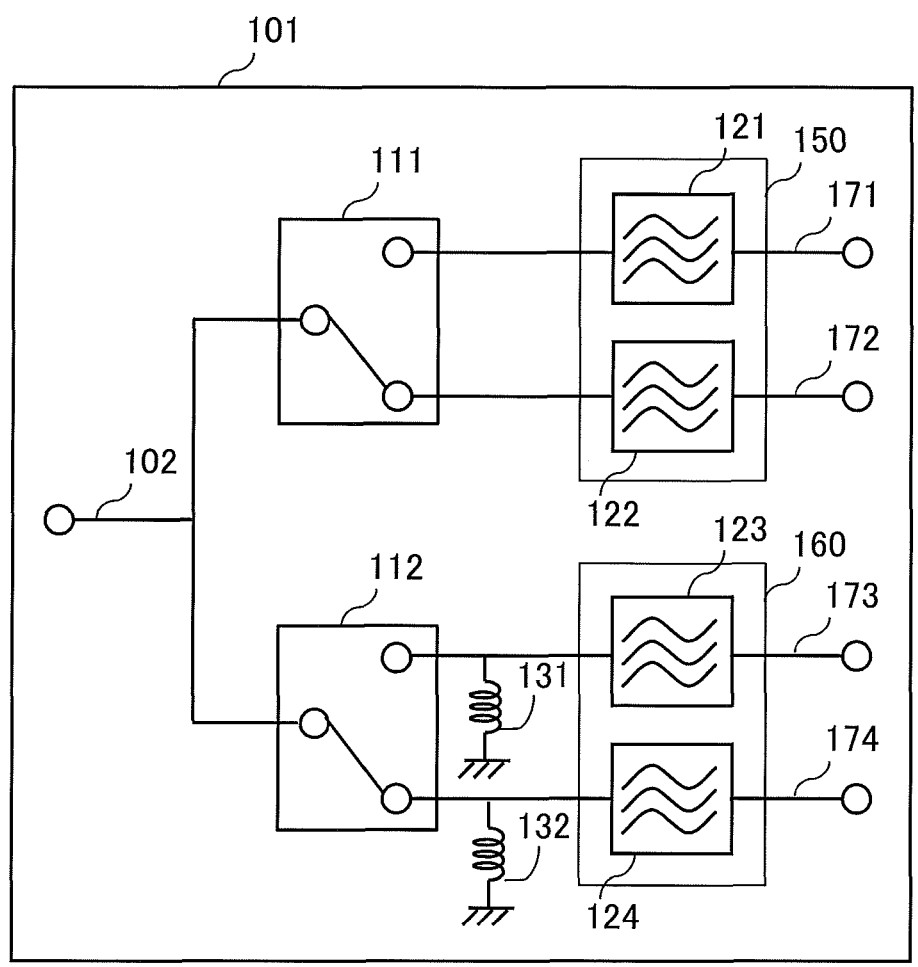
FIG. 8 shows the filter module according to a fourth embodiment of the present invention.

FIG. 8 is a configurational drawing of a filter module 400 according to the present embodiment. The filter module 400 of the present embodiment is obtained by determining connection locations of the first matching circuit 131 and the second matching circuit 132 in the filter module 100 in accordance with a principle described next.

Specifically, the first matching circuit 131 is connected to, among the first transmission filter 121 and the first reception filter 123, the one having a lower filter impedance when viewed from the antenna terminal 102 side in the respective passbands, and a matching circuit is not connected to the other one. Furthermore, the second matching circuit 132 is connected to, among the second transmission filter 122 and the second reception filter 124, the one having a lower impedance when viewed from the antenna terminal 102 side in the respective passbands, and a matching circuit is not connected to the other one. It should be noted that, "filter impedance when viewed from the antenna terminal 102 side" refers only to impedance of each filter of filters 121, 122, 123, or 124; and does not refer to impedance including the first switch circuit 111 or the second switch circuit 112 etc.

In one example, the filter module 400 supports band 1 and band 2. More specifically, the passband of the first transmission filter 121 is the transmission band of band 1, and the passband of the first reception filter 123 is the reception band of band 1. Furthermore, the passband of the second transmission filter 122 is the transmission band of band 2, and the passband of the second reception filter 124 is the reception band of band 2.

In FIG. 9, (a) shows filter impedance characteristics when viewed from the antenna terminal 102 side in the respective passbands of the first transmission filter 121 and the first reception filter 123. The solid line in (a) of FIG. 9 represents impedance of the first transmission filter 121 when viewed from the antenna terminal 102 side, and the broken line in (a) of FIG. 9 represents impedance of the first reception filter 123 when viewed from the antenna terminal 102 side. As shown in (a) of FIG. 9, when viewed from the antenna terminal 102 side, the first reception filter 123 has lower impedance when compared to the first transmission filter 121. Thus, the first matching circuit 131 is connected between the first reception filter 123 and the second switch circuit 112.

In FIG. 9, (b) shows filter impedance characteristics when viewed from the antenna terminal 102 side in the respective passbands of the second transmission filter 122 and the second reception filter 124. The solid line in (b) of FIG. 9 represents impedance of the second transmission filter 122 when viewed from the antenna terminal 102 side, and the broken line in (b) of FIG. 9 represents impedance of the second reception filter 124 when viewed from the antenna terminal 102 side. As shown in (b) of FIG. 9, when viewed from the antenna terminal 102 side, the second reception filter 124 has lower impedance when compared to the second transmission filter 122. Thus, the second matching circuit 132 is connected between the second reception filter 124 and the second switch circuit 112.

Figure 10:
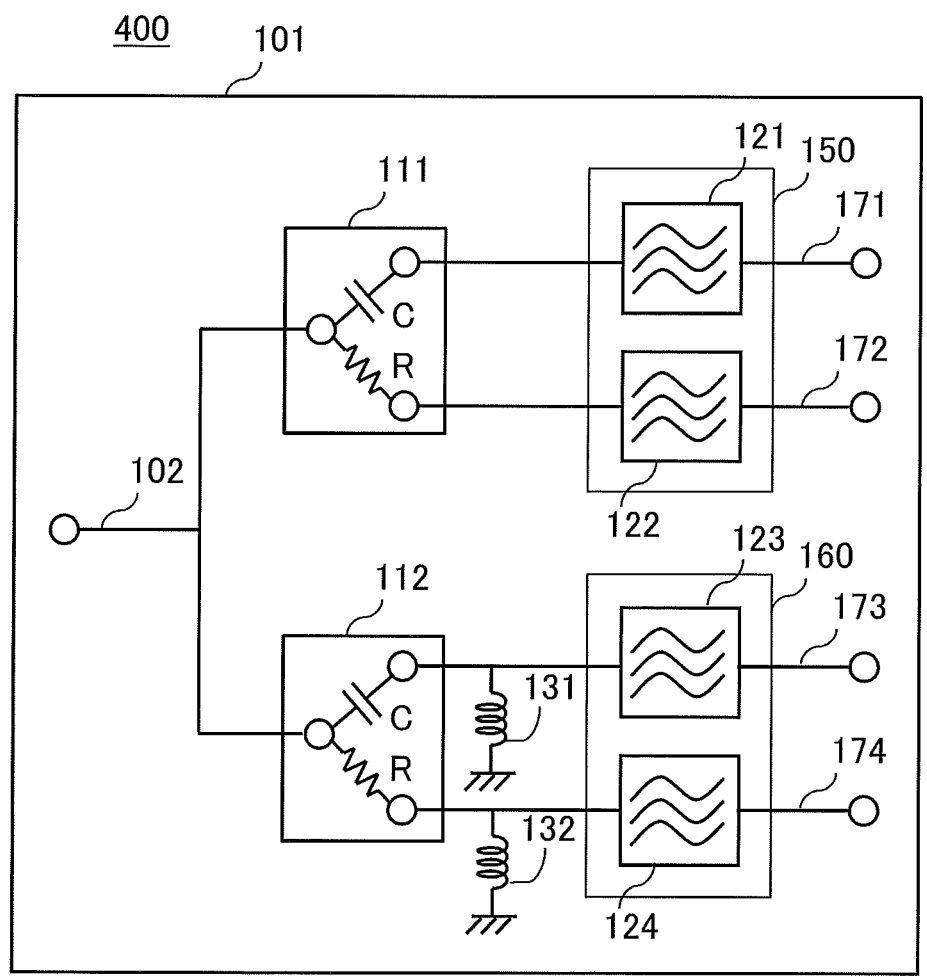
FIG. 10 shows the impedance characteristics of each filter in the filter module according to the fourth embodiment of the present invention.

In the following, the reason why the connection locations of the matching circuits 131 and 132 are determined in accordance with such a principle will be described. FIG. 10 shows the filter module 400 when band 2 is selected, and equivalent circuits are shown for the first switch circuit 111 and the second switch circuit 112. Thus, in each of the switch circuits 111 and 112, in the ON-state of the switch, connection is formed through an ON-resistance R of the switch, and, in the OFF-state, connection is formed through capacitor C. Therefore, since the resistance R will be connected in series in the ON-state of the switch, reduction of insertion loss of the passband occurs. Thus, in order to suppress reduction of insertion loss of the passband in each of the filters, it is effective means to reduce the effect of the resistance R in the ON-state of the switch. Here, the overall impedance $Z_2$ obtained when impedance $Z_1$ and resistance $R_1$ are connected can be represented by [Number 1].

$$Z_2 = Z_1 + R_1 \quad \text{[Number 1]}$$

Since loss at resistance $R_1$ depends on the proportion of $R_1$ with respect to the overall impedance $Z_2$, loss at the ON-resistance R of the switch of the second switch circuit 112 becomes small when impedance $Z_1$ of the matching circuits 131 and 132 becomes large. Therefore, by respectively connecting the matching circuits 131 and 132 before the filters 123 and 124 to increase the overall impedance in the passband, it is possible to suppress the effect of loss at the ON-resistance of the switch of the second switch circuit 112.

In particular, since the passbands of the filters 123 and 124 each formed with a SAW (surface acoustic wave) resonator generally become capacitive, an inductance component (inductance element) connected (to a shunt) between the signal route and ground is used as the matching circuits 131 and 132. However, when the pass characteristic of each of the filters 123 and 124 formed with a SAW resonator is inductive, a capacitance component (capacitance element) connected (to a shunt) between the signal route and ground is used as the matching circuits 131 and 132.

Therefore, as shown in (a) of FIG. 9, in a case where the first reception filter 123 has a lower impedance compared to the first transmission filter 121 when viewed from the antenna terminal 102 side; it is possible to increase the impedance of the circuit on the first reception filter 123 side when viewed from the antenna terminal 102 side, by connecting the first matching circuit 131 between the first reception filter 123 and the second switch circuit 112. In this case, a matching circuit is not connected between the first transmission filter 121 and the first switch circuit 111. As a result, it is possible to reduce the occupying area of the matching circuit, and seek increases in the levels of characteristics of each filter in the filter module 400. Furthermore, as shown in (b) of FIG. 9, in a case where the second reception filter 124 has a lower impedance compared to the second transmission filter 122 when viewed from the antenna terminal 102 side; it is possible to increase the impedance of the circuit on the second reception filter 124 side when viewed form the antenna terminal 102 side, by also connecting the second matching circuit 132 between the second reception filter 124 and the second switch circuit 112. In this case, a matching circuit is not connected between the second transmission filter 122 and the first switch circuit 111. As a result, it is possible to reduce the occupying area of the matching circuit, and seek increases in the levels of characteristics of each filter in the filter module 400.

As described above, the filter module 400 of the present embodiment enables reduction in the occupying area of the matching circuit, and suppression of reduction of the insertion loss caused by the ON-resistance of the switch. It is also possible to determine the connection location by the above described principle for only one of the first matching circuit 131 and the second matching circuit 132. As a result, it is possible to suppress reduction of the insertion loss caused by the ON-resistance of the switch when either one of band 1 or band 2 is used.

Fifth Embodiment

Figure 11:
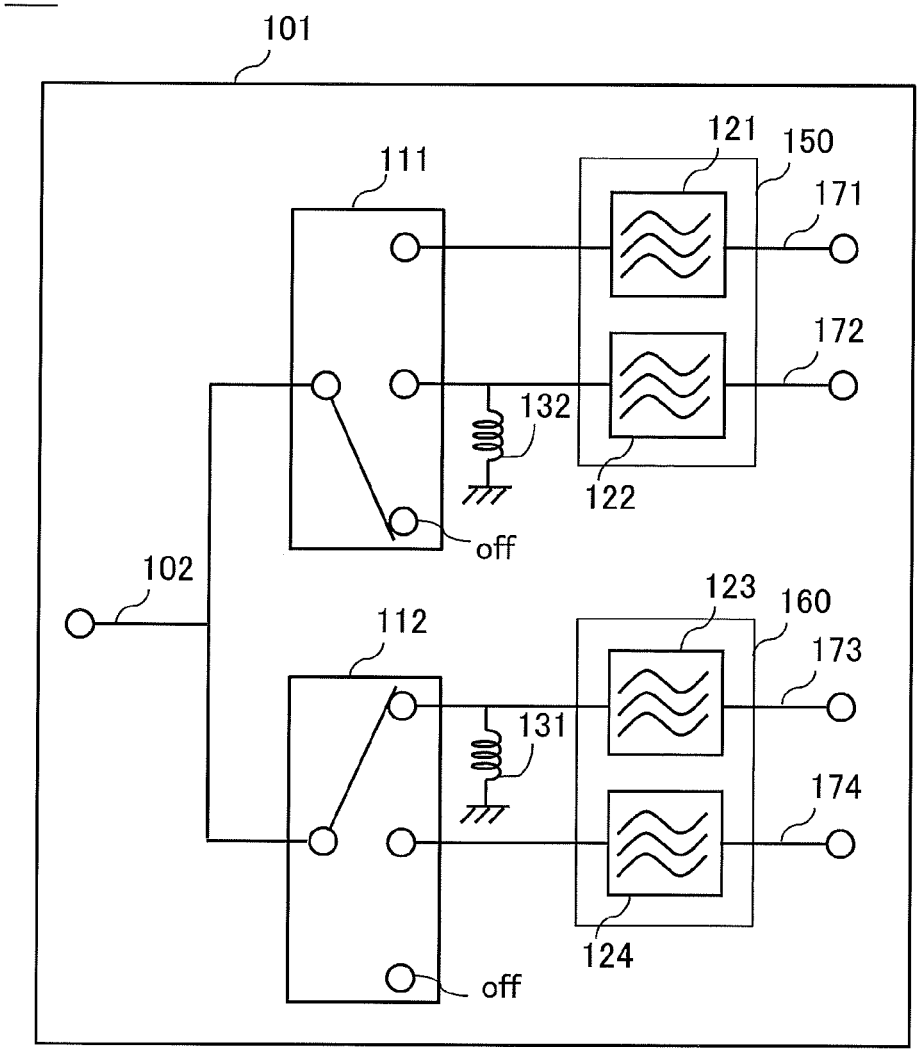
FIG. 11 shows the filter module according to a fifth embodiment of the present invention.

In the following, a fifth embodiment of the present invention will be described. FIG. 11 is a configurational drawing of a filter module 500 according to the present embodiment. The filter module of the present embodiment is obtained by, in the filter module 300 according to the third embodiment, enabling the first switch circuit 111 to select a state that is electrically disconnected with respect to both the first transmission filter 121 and the second transmission filter 122, i.e., a state of not being connected to any of the filters, for example an OFF-state; and enabling the second switch circuit 112 to select a state that is electrically disconnected with respect to both the first reception filter 123 and the second reception filter 124, i.e., a state of not being connected to any of the filters, for example an OFF-state.

With this, the filter module 500 can support the TDD (Time Division Duplex) method. For example, by setting the first switch circuit 111 in a state of be not being connected to any of the filters, e.g., OFF-state, and by connecting the second switch circuit 112 to the first reception filter 123; it is possible to connect the antenna terminal 102 only to the first reception filter 123 and use the first reception filter 123 as a filter for transmission-and-reception bands in the TDD method. In this case, since the first switch circuit 111 is in a state of not being connected to any of the filters, e.g., OFF-state, it is possible to reduce leakage of signals to other filters and suppress reduction of isolation characteristic. It should be noted that the present embodiment may be applied to the filter module 100 or 200 according to the first or second embodiment.

Sixth Embodiment

Figure 12:
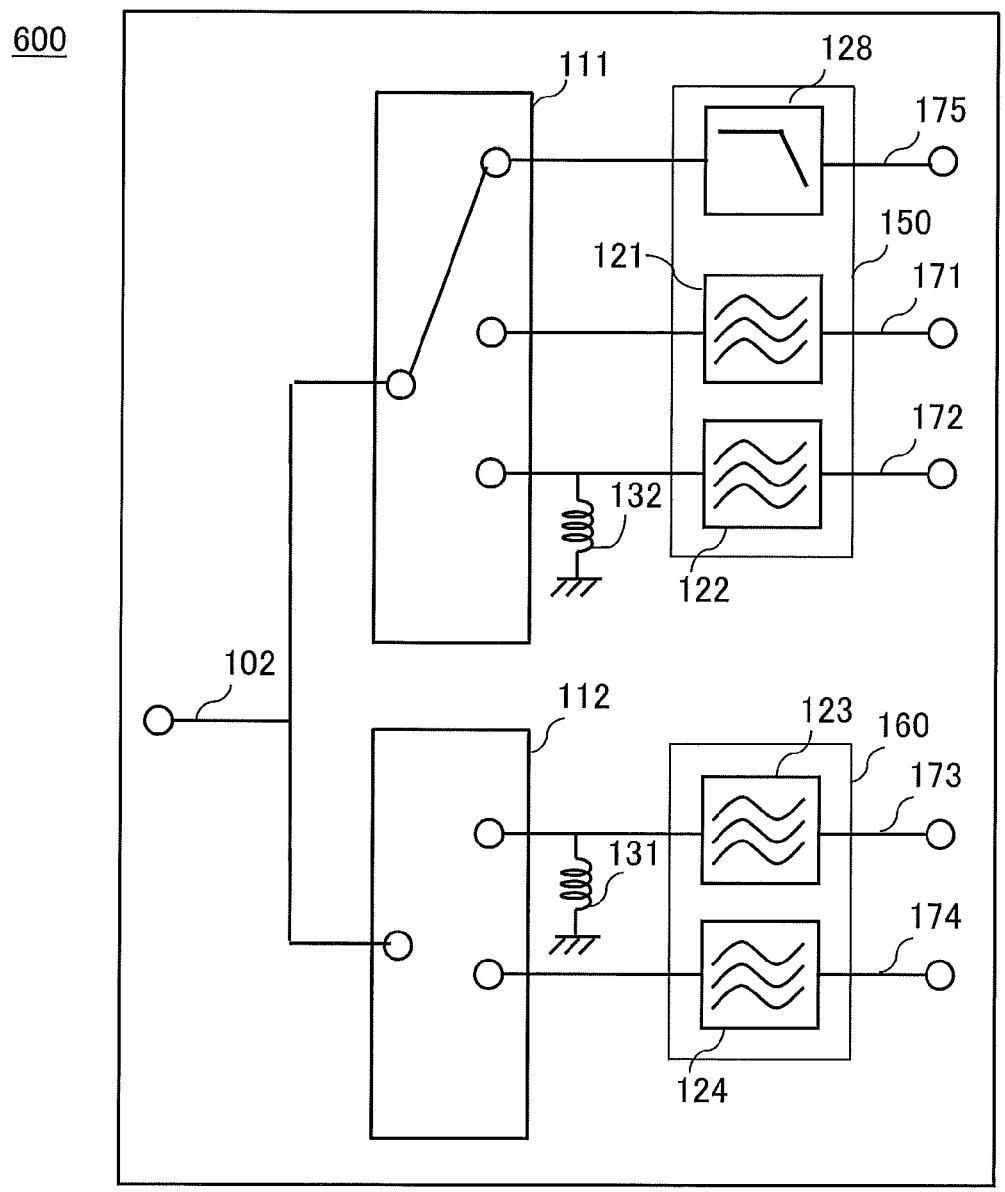
FIG. 12 shows the filter module according to a sixth embodiment of the present invention.

In the following, a sixth embodiment of the present invention will be described. FIG. 12 is a configurational drawing of a filter module 600 according to the present embodiment. The filter module of the present embodiment is obtained by, in the filter module 300 according to the third embodiment, adding another filter side terminal to the first switch circuit 111, and connecting a transmission side terminal 175 through a low pass filter 128 of the filter side terminal.

The first transmission filter 121 and the first reception filter 123 each use, in one example, a transmission frequency band: 824 to 849 [MHz] and a reception frequency band: 869 to 894 [MHz] of band 5 in LTE as passbands; and the second transmission filter 122 and the second reception filter 124 each use, in one example, a transmission frequency band: 815 to 830 [MHz] and a reception frequency band: 860 to 875 [MHz] of band 18 as passbands. Thus, the filter module 600 supports band 5 and band 18, and four filters for transmission and for reception in each of the bands are used.

In addition, when the filter module 600 is applied in communication with the TDD method, for example, the first reception filter 123 is used as a filter for reception, and, for example, the low pass filter 128 is used as a filter for transmission. More specifically, at the time of reception, the second switch circuit 112 is connected to the first reception filter 123, and the first switch circuit is set in the OFF-state. At the time of transmission, the first switch circuit 111 is connected to the low pass filter 128, and the second switch circuit 112 is set in the OFF-state. With this, it becomes possible to reduce leakage of signals and suppress deterioration of isolation characteristics. Furthermore, by using the low pass filter 128, loss can be reduced.

It should be noted that, it is possible to add another filter side terminal to the second switch circuit 112, and connect a low pass filter to the filter side terminal as a filter for reception.

Seventh Embodiment

Figure 13:
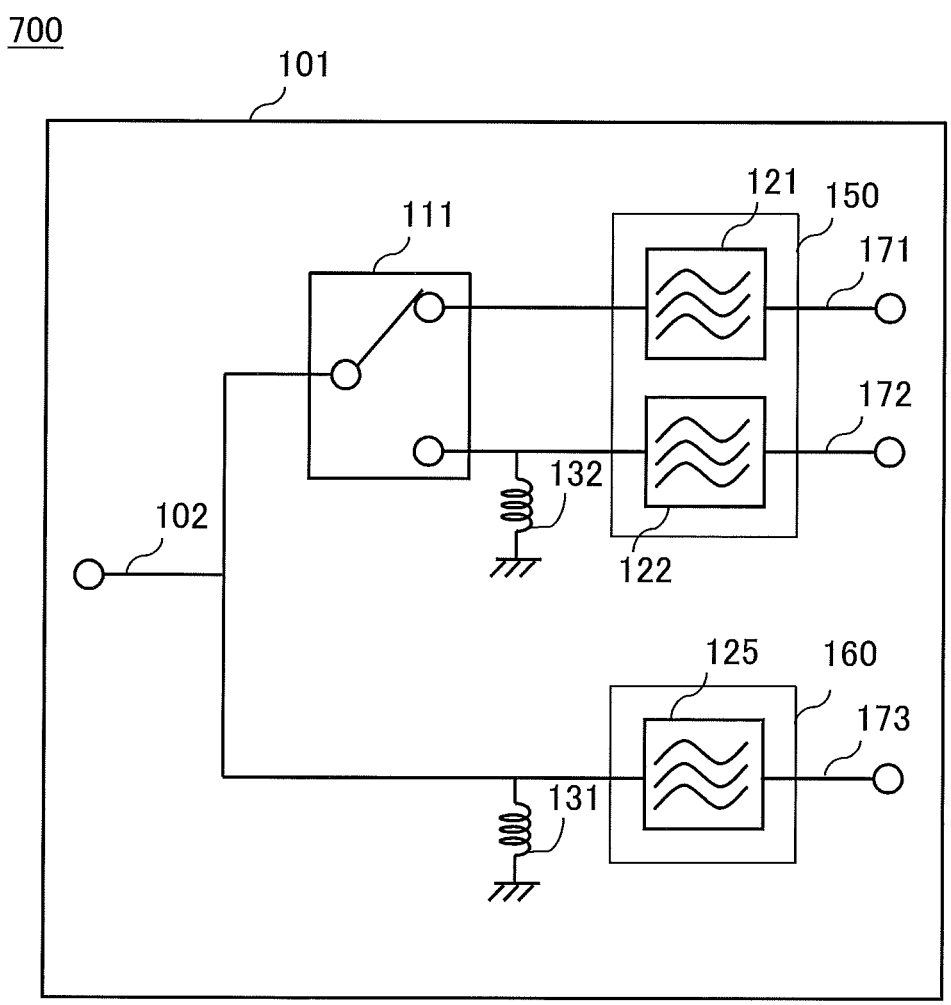
FIG. 13 shows the filter module according to a seventh embodiment of the present invention.

In the following, a seventh embodiment of the present invention will be described. FIG. 13 is a configurational drawing of a filter module 700 according to the present embodiment. In one example, the filter module 700 of the present embodiment supports band 1 and band 4 shown in FIG. 2. The reception band of band 1 and the reception band of band 4 overlap each other. Thus, the filter module 700 is obtained by having a single reception filter 125 to dual-function as the first reception filter 123 and the second reception filter 124 in the filter module 300 of the third embodiment, and by removing the second switch circuit. Thus, the filter module 700 includes the antenna terminal 102, the first switch circuit 111 having one end thereof connected to the antenna terminal 102, the first transmission filter 121 and the second transmission filter 122 each having one end thereof connect to the other ends of the first switch circuit 111, and the reception filter 125 having one end thereof connected to the antenna terminal 102. Furthermore, the first matching circuit 131 is connected between the first switch circuit 111 and the first transmission filter 121, and the second matching circuit 132 is connected between the first switch circuit 111 and the second transmission filter 122.

It should be noted that, when band 3 and band 4 shown in FIG. 2 are supported, the transmission band of band 3 and the transmission band of band 4 overlap each other. Thus, in the filter module 300 of the third embodiment, a single transmission filter may dual-function as the first transmission filter 121 and the second transmission filter 122, and the first switch circuit 111 may be removed.

In addition, the present embodiment can be applied to the filter modules 500 and 600 according to the fifth and sixth embodiments. In such case, when communicating using the TDD method, for the purpose of suppressing leakage of signals to a filter that is not utilized in transmission and reception, it is preferable to not remove the first switch circuit 111 or the second switch circuit 112 in order to have a configuration capable of switching to the OFF-state.

In the example of the filter module 600 of the sixth embodiment, reception bands of band 5 and band 18 overlap each other. Thus, as the filter for reception, a reception filter having a passband characteristic of 860 to 894 [MHz] can dual-function as the first reception filter 123 and the second reception filter 124. Furthermore, the transmission bands of band 5 and band 18 also overlap each other. Thus, as the filter for transmission, a transmission filter having a passband characteristic of 815 to 849 [MHz] can dual-function as the first transmission filter 121 and the second transmission filter 122.

A case will be described in which a single filter is not assigned with dual functions in overlapping frequency. In this case, the first transmission filter 121 covering 824 to 849 [MHz], the second transmission filter 122 covering 815 to 830 [MHz], the first reception filter 123 covering 869 to 894 [MHz], and the second reception filter 124 covering 860 to 875 [MHz] are used. Discussed in the following is a case in which the first reception filter is used as a reception filter for TDD. In this case, the low pass filter 128 is used as a third transmission filter on the transmission side for TDD. Thus, in this case, the number of transmission filters is three, and the number of reception filters is two, resulting in a larger number of transmission filters than the number of reception filters. Associated with this, regarding the number of filter side terminals in the switch circuit, the number of terminals for transmission becomes equal to or larger than the number of terminals for reception.

Discussed next is a case of covering both the reception frequency band of Band 5 and the reception frequency band of Band 18 by using the first reception filter 123 that covers 860 to 894 [MHz]. In this case, the number of transmission side filters is three and the number of reception side filters is one, and the number of transmission filters becomes larger than the number of reception filters.

Discussed next is a case of covering both the transmission frequency band of Band 5 and the transmission frequency band of Band 18 by using the first transmission filter 121 that covers 815 to 849 [MHz]. In this case, the number of transmission side filters is two and the number of reception side filters is two, resulting in an equal number for the number of transmission filters and the number of reception filters. Thus, when the number of reception side filters assigned with dual functions increases, the number of reception side filters may become larger than the number of transmission filters.

Thus, when a single filter is assigned with dual functions in an overlapping frequency band, the number of transmission filters and the number of reception filters in the case of not being assigned with dual functions are to be compared. The same applies for the number of filter side terminals for a switch circuit.

When passbands overlap as described above, it is possible to reduce the number of filters and miniaturize the filter module by assigning dual functions to a filter. Dual-functioning of a filter can be conducted as appropriate by selecting passband characteristics of a transmission filter and a reception filter, presence or absence of a switch circuit, and the number of filter side terminals, in accordance with the band used for transmission and reception. There are no limits in the number and size of the filters for transmission and reception. It should be noted that, for the purpose of supporting pass characteristics and attenuation characteristics of each overlapping band, an attenuation pole may be altered so as to have pass characteristics and attenuation characteristics in accordance with each band, by forming the filter that is assigned with dual functions with a rudder type filter, connecting a tunable element to a parallel resonator thereof, and controlling the tunable element. Alternatively, the attenuation pole may be altered so as to have pass characteristics and attenuation characteristics in accordance with each band, by connecting a matching circuit including multiple matching circuit elements to the parallel resonator of the filter formed with the rudder type filter, and switching the matching circuit elements.

Eighth Embodiment

Figure 14:
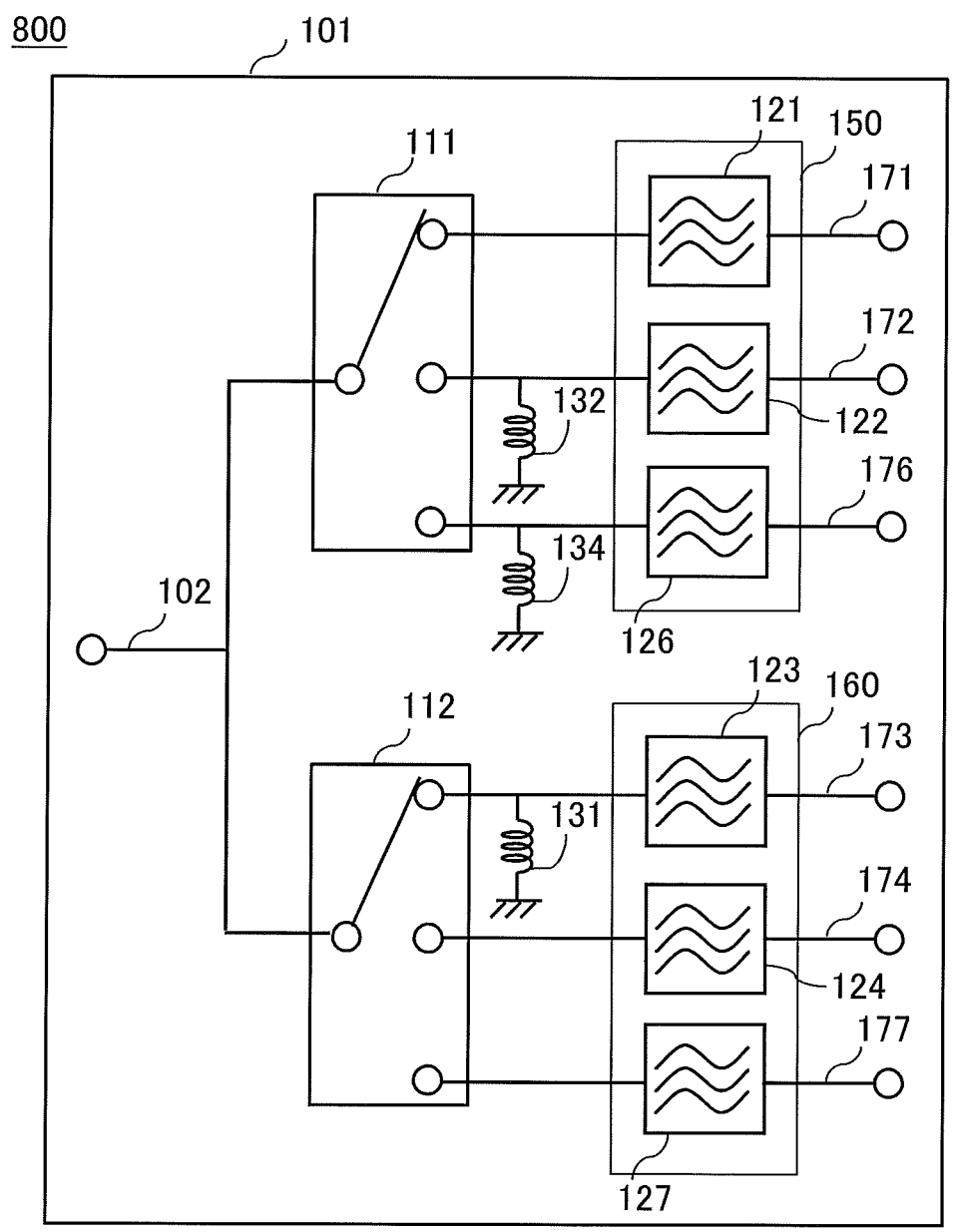
FIG. 14 shows the filter module according to an eighth embodiment of the present invention.

In the following, an eighth embodiment of the present invention will be described. FIG. 14 is a configurational drawing of a filter module 800 according to the present embodiment. In the filter module 800 of the present invention, the numbers of transmission filters and reception filter are not limited to two. Depending on the number of bands to be supported, it is possible to increase the number of connection destinations of the first switch circuit and the second switch circuit, and connect three or more of these filters and matching circuits. The filter module 800 of the present embodiment is obtained by, in the filter module 100 according to the first embodiment, adding another connection destination to the first switch circuit 111 and the second switch circuit 112 each, and by connecting thereto a third transmission filter 126, a third reception filter 127, and a third matching circuit 134. With this, the filter module 800 can support three bands.

In the filter module 800, a transmission filter (the second transmission filter 122 shown in FIG. 14) whose center frequency of the passband is the lowest among all the transmission filters is disposed between the other transmission filters 121 and 126. Furthermore, a reception filter (the second reception filter 124 shown in FIG. 14) whose center frequency of the passband is the lowest among all the reception filters may be disposed between the other reception filters 123 and 127.

Generally, a filter whose passband frequency is higher generates larger noise due to electromagnetic field coupling. Thus, disposing such a filter inwards of a filter group has an adverse effect on filters adjacent at both sides thereof. In the filter module 800, since the filter whose center frequency of the passband is the lowest is disposed inwards of the filter group, and since filters whose center frequencies of respective passbands are higher than that are disposed toward the end, effect of noise is reduced when compared to disposing a filter whose center frequency of the passband is high inwards of the filter group.

In addition, the number of transmission filters or reception filters may be, for example, four or more in accordance with the number of bands that are to be supported. Also in a case where the number of transmission filters or reception filters is four or more, a filter whose center frequency of the passband is low is preferably disposed toward the inwards of the filter group. With this, similarly advantageous effects can be obtained.

Ninth Embodiment

Figure 15:
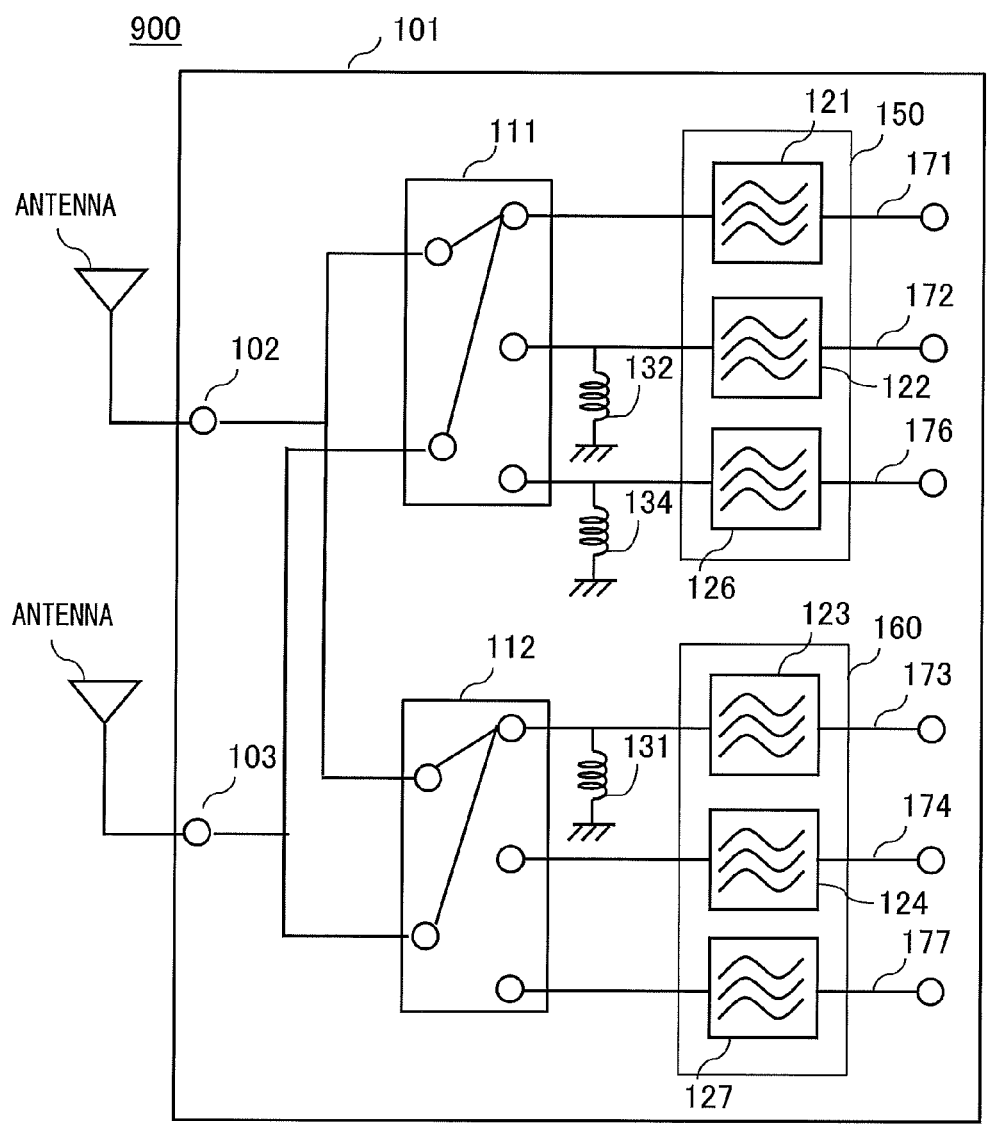
FIG. 15 shows the filter module according to a ninth embodiment of the present invention.
Figure 16:
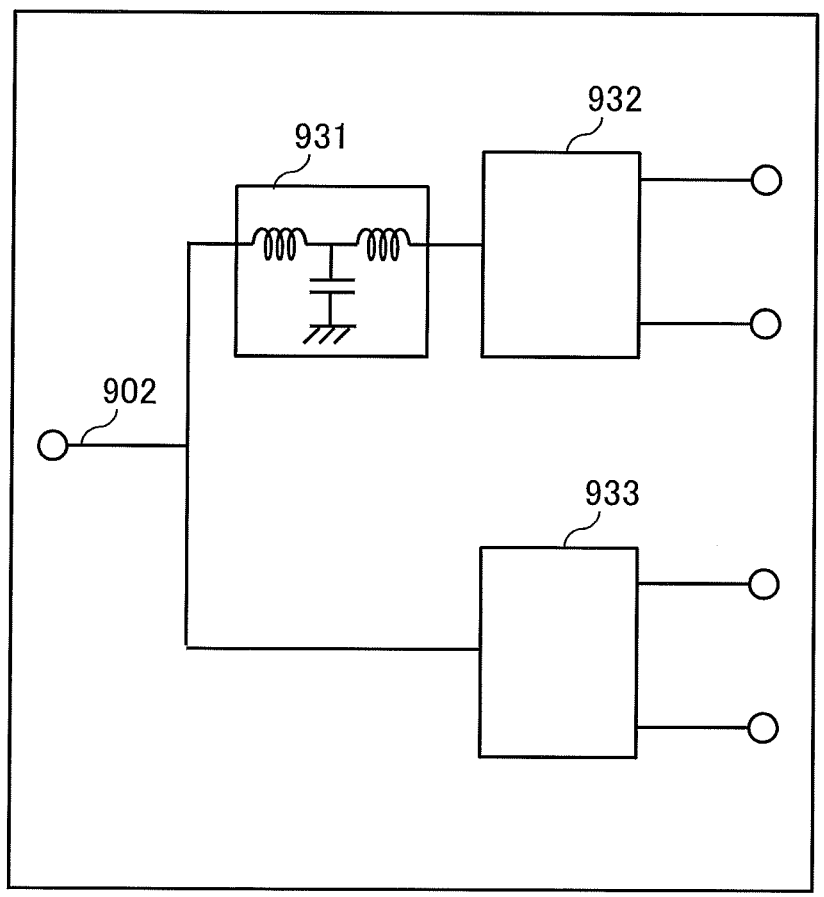
FIG. 16 shows a hitherto known multi-duplexer module.
Figure 17:
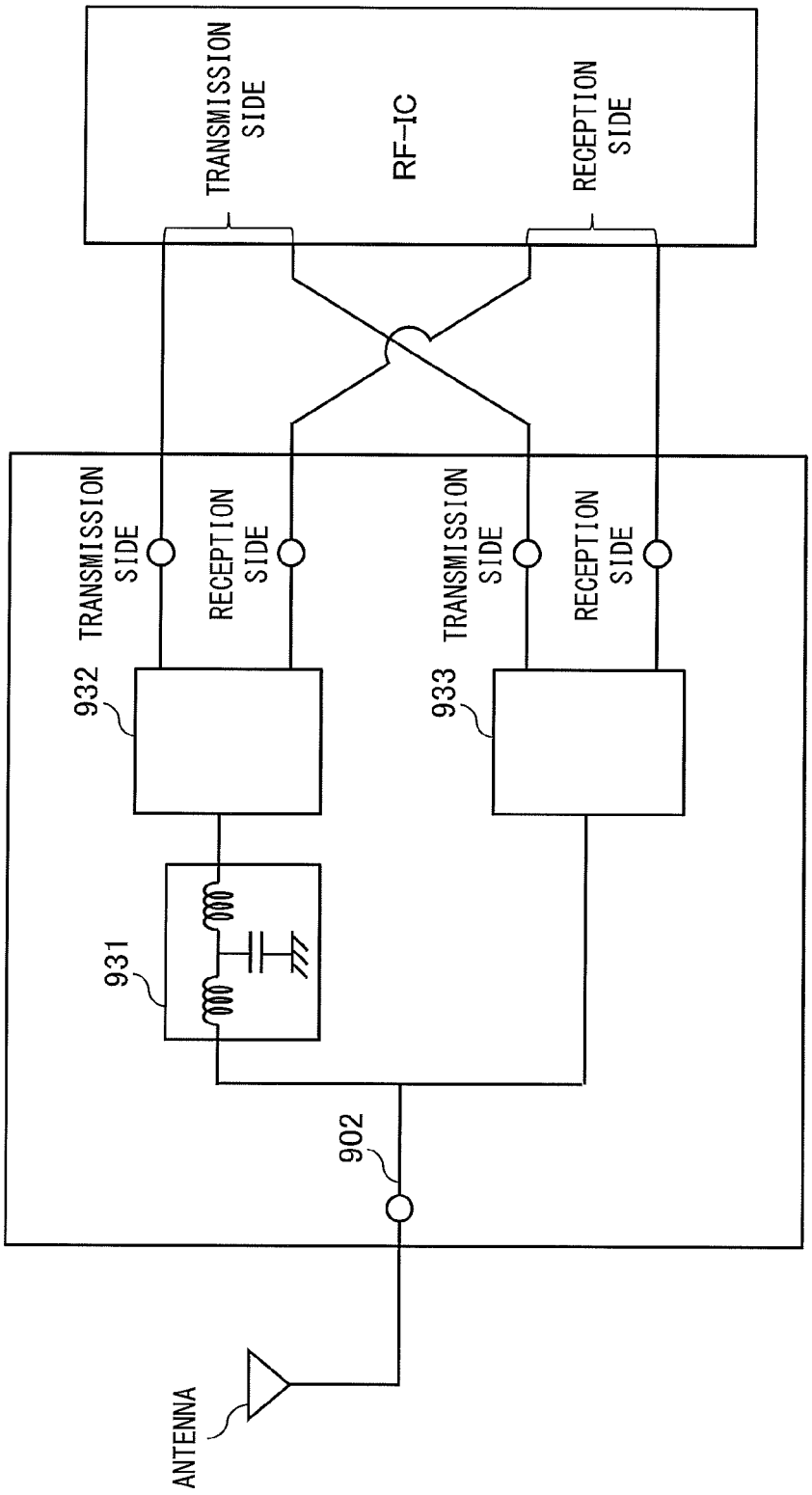
FIG. 17 shows an example of connections between an RF-IC and the hitherto known multi-duplexer module.

In each of the above described embodiments, although the number of antenna terminals in the switch circuit is set as one under a premise of the number of antennas used for receiving and transmitting a desired signal being one; the number of antenna terminals may more than one in each of the embodiments. For example, when a plurality of antennas are used for receiving and transmitting desired signals, the number of antenna terminals and the number of antennas may be set equal. FIG. 15 is a configurational drawing of a filter module 900 according to the present embodiment. In the example shown in FIG. 15, the filter module 900 is obtained by adding, to the filter module 800 according to the eighth embodiment, the two antenna terminal 102 and 103 respectively connected to the first switch circuit 111 and the second switch circuit 112.

Although each of the embodiments of the filter module of the present invention has been described above, the present invention is not limited thereto, and is also applicable to embodiments in which changes, substitutions, additions, omissions, and/or the like are made as appropriate. In addition, each constituent element described in each of the embodiments can be combined to provide a new embodiment. Furthermore, the present invention can be achieved not only by the whole multi-duplexer module, but also by a part of the multi-duplexer module or other electronic circuit modules when combined with other filters.

INDUSTRIAL APPLICABILITY

The present invention is useful in a filter module used in mobile phones etc., and is particularly useful in a filter module capable of handling multiple bands.

DESCRIPTION OF THE REFERENCE CHARACTERS 100, 200, 300, 400, 500, 600 filter module
101 substrate
102, 103, 902 antenna terminal
111 first switch circuit
112 second switch circuit
121 first transmission filter
122 second transmission filter
123 first reception filter
124 second reception filter
125 reception filter
126 third transmission filter
127 third reception filter
131 first matching circuit
132 second matching circuit
133, 134 third matching circuit
150 first predetermined area
160 second predetermined area
171, 172, 175, 176 transmission side terminal
173, 174, 177 reception side terminal
191 first branch part
192 second branch part
900 multiplexer module
931 matching circuit
932 first duplexer
933 second duplexer

The invention claimed is:
1. A filter module comprising:
an antenna terminal;
a first transmission filter having a transmission passband in a first band;
a second transmission filter having a transmission passband in a second band;
a first reception filter having a reception passband in the first band;
a second reception filter having a reception passband in the second hand, at least one of the respective passbands of the first transmission filter and the first reception filter overlapping the respective passband of one of the second transmission filter and the second reception filter;

a first switch circuit electrically connected to the antenna terminal and to respective switch side terminals of the first transmission filter and the second transmission filter;

a second switch circuit electrically connected to the antenna terminal and to respective switch side terminals of the first reception filter and the second reception filter; and a first matching circuit electrically connected to the respective switch side terminal of a one of the first transmission filter and the first reception filter having a passband that overlaps the respective passband of one of the second transmission filter and the second reception filter to a lesser extent than the respective passband of the other one of the first transmission filter and the first reception filter, the respective switch side terminal of the other one of the first transmission filter and the first reception filter not being connected to any matching circuit.

2. The filter module of claim 1 wherein at least one of the respective passbands of the second transmission filter and the second reception filter overlaps the respective passband of one of the first transmission filter and the first reception filter, and a second matching circuit is connected to the respective switch side terminal of a one of the second transmission filter and the second reception filter having a passband that that overlaps the respective passband of one of the first transmission filter and the first reception filter to a lesser extent than the respective passband of the other one of the second transmission filter and the second reception filter.

3. The filter module of claim 1 wherein the first switch circuit has a state of being electrically disconnected from both the first transmission filter and the second transmission filter, and the second switch circuit has a state of being electrically disconnected from both the first reception filter and the second reception filter.

4. The filter module of claim 1 wherein the transmission passband in the first band and the transmission passband in the second band overlap each other, and the first transmission filter and the second transmission filter are formed from a single filter.

5. The filter module of claim 1 wherein the reception passband in the first band and the reception passband in the second band overlap each other, and the first reception filter and the second reception filter are formed from a single filter.

6. The filter module of claim 1 further comprising a third transmission filter having a transmission passband in a third band, the first switch circuit being further connected to a switch side terminal of the third transmission filter, a one of the first transmission filter, the second transmission filter, and the third transmission filter having a center frequency the respective passband that is the lowest among the first transmission filter, the second transmission filter, and the third transmission filter being disposed between the other two of the first transmission filter, the second transmission filter, and the third transmission filter.

7. The filter module of claim 1 further comprising a third reception filter having a reception passband in a third band, wherein the second switch circuit being further connected to a switch side terminal of the third reception filter, a one of the first reception filter, the second reception filter, and the third reception filter having a center frequency the respective passband that is the lowest among the first reception filter, the second reception filter, and the third reception filter being disposed between the other two of the first reception filter, the second reception filter, and the third reception filter.

8. The filter module of claim 1 wherein a second matching circuit is electrically connected to a signal route between the first switch circuit and the third transmission filter.

9. The filter module of claim 7 wherein a second matching circuit is electrically connected to a signal route between the second switch circuit and the third reception filter.

10. The filter module of claim 1 further comprising a low pass filter connected to one of the first switch circuit and the second switch circuit.

11. The filter module of claim 1 wherein the first matching circuit includes a grounded inductor.

12. The filter module of claim 2 wherein the respective switch side terminal of the other one of the second transmission filter and the second reception filter is not connected to any matching circuit.

13. A filter module comprising:
an antenna terminal;
a first transmission filter having a transmission passband in a first band;
a second transmission filter having a transmission passband in a second band;
a first reception filter having a reception passband in the first band;
a second reception filter having a reception passband in the second band, at least one of the respective passbands of the first transmission filter and the first reception filter overlapping the respective passband of one of the second transmission filter and the second reception filter;
a first branch circuit electrically connected to the antenna terminal and to respective branch circuit side terminals of the first transmission filter and the second transmission filter;
a second branch circuit electrically connected to the antenna terminal and to respective branch circuit side terminals of the first reception filter and the second reception filter; and
a first matching circuit electrically connected to the respective branch circuit side terminal of a one of the first transmission filter and the first reception filter having a passband that overlaps the respective passband of one of the second transmission filter and the second reception filter to a lesser extent than the respective passband of the other one of the first transmission filter and the first reception filter, the respective switch side terminal of the other one of the first transmission filter and the first reception filter not being connected to any matching circuit.

14. The filter module of claim 13 further comprising a second matching circuit electrically connected to a signal path between the antenna terminal and at least one of the first branch circuit and the second branch circuit.

15. A filter module comprising:
an antenna terminal;
a first transmission filter having a transmission passband in a first band;
a second transmission filter having a transmission passband in a second band;
a first reception filter having a reception passband in the first band;
a second reception filter having a reception passband in the second band;
a first switch circuit connected to the antenna terminal and to respective switch side terminals of the first transmission filter and the second transmission filter;
a second switch circuit connected to the antenna terminal and to respective switch side terminals of the first reception filter and the second reception filter; and a first matching circuit connected to the respective switch side terminal of a one of the first transmission filter and the first reception filter having a lower impedance on an antenna terminal side in the respective passband, the respective switch side terminal of the other one of the first transmission filter and the first reception filter not being connected to any matching circuit.

16. The filter module of claim 1 wherein a second matching circuit is connected to the respective switch side terminal of a one of the second transmission filter and the second reception filter having a lower impedance on an antenna terminal side in the respective passbands than the other one of the second transmission filter and the second reception filter.

17. The filter module of claim 16 wherein the respective switch side terminal of the other one of the second transmission tilter and the second reception filter is not connected to any matching circuit.

18. The filter module of claim 15 further comprising a matching circuit electrically connected between the antenna terminal and both the first switch circuit and the second switch circuit.

19. A filter module comprising:
an antenna terminal;
a first transmission filter having a transmission passband in a first band;
a second transmission filter having a transmission passband in a second band;
a first reception filter having a reception passband in the first band;
a second reception filter having a reception passband in the second band;
a first branch circuit connected to the antenna terminal and to respective branch circuit side terminals of the first transmission filter and the second transmission filter;
a second branch circuit connected to the antenna terminal and to respective branch circuit side terminals of the first reception filter and the second reception filter, and
a first matching circuit connected to the respective branch circuit side terminal of a one of the first transmission filter and the first reception filter having a lower impedance on an antenna terminal side in the respective passband, the respective branch circuit side terminal of the other one of the first transmission filter and the first reception filter not being connected to any matching circuit.

20. The filter module of claim 19 further comprising a second matching circuit electrically connected between the antenna terminal and both the first branch circuit and the second branch circuit.

* * * * *

UNITED STATES PATENT AND TRADEMARK OFFICE
CERTIFICATE OF CORRECTION

PATENT NO. : 9,118,302 B2  
APPLICATION NO. : 14/237168  
DATED : August 25, 2015  
INVENTOR(S) : Hidehito Shimizu et al.

Page 1 of 1

It is certified that error appears in the above-identified patent and that said Letters Patent is hereby corrected as shown below:

In the Claims:

Column 14, Line 64, Claim 1, delete "hand" and insert -- band --.

Column 15, Line 52, Claim 6, delete "frequency the" and insert -- frequency in the --.

Column 15, Line 60, Claim 7, delete "wherein".

Column 15, Line 63, Claim 7, delete "frequency the" and insert -- frequency in the --.

Column 16, Line 1, Claim 8, delete "1" and insert -- 6 --.

Column 17, Line 8, Claim 16, delete "1" and insert -- 15 --.

Column 17, Line 16, Claim 17, delete "tilter" and insert -- filter --.

Signed and Sealed this  
Fifteenth Day of March, 2016

Michelle K. Lee  
*Director of the United States Patent and Trademark Office*